United States Patent

Yoshida et al.

[11] Patent Number: 6,070,062
[45] Date of Patent: May 30, 2000

[54] MOBILE RADIO WAVE RECEIVER WITH ADAPTIVE AUTOMATIC GAIN CONTROL

[75] Inventors: Koutaro Yoshida, Sendai; Yoshinori Osawa, Yokohama; Nozomi Koh, Sagamihara, all of Japan

[73] Assignee: Matsushita Electric Industrial Co., Ltd., Osaka, Japan

[21] Appl. No.: 09/049,381

[22] Filed: Mar. 27, 1998

[30] Foreign Application Priority Data

Mar. 28, 1997 [JP] Japan ...................................... 9-77569

[51] Int. Cl.$^7$ ...................................................... H04B 1/06
[52] U.S. Cl. ................................... 455/234.1; 455/245.1; 455/246.1; 455/266
[58] Field of Search ............................ 455/232.1, 234.1, 455/234.2, 239.1, 240.1, 241.1, 245.1, 246.1, 250.1, 254, 266, 340; 375/345, 346; 714/704

[56] References Cited

U.S. PATENT DOCUMENTS

| | | | |
|---|---|---|---|
| 5,263,187 | 11/1993 | Sugawa et al. | 455/245.1 |
| 5,287,556 | 2/1994 | Cahill | 455/266 |
| 5,321,851 | 6/1994 | Sugayama et al. | 455/246.1 |
| 5,339,454 | 8/1994 | Kuo et al. | 455/254 |
| 5,369,792 | 11/1994 | Matsumoto et al. | 455/245.1 |
| 5,408,698 | 4/1995 | Serizawa et al. | 455/246.1 |
| 5,630,220 | 5/1997 | Yano | 455/234.1 |
| 5,734,974 | 3/1998 | Callaway, Jr. et al. | 455/234.1 |
| 5,745,847 | 4/1998 | Matsuo | 455/234.1 |
| 5,898,699 | 4/1999 | Chiba | 714/704 |

FOREIGN PATENT DOCUMENTS

| | | |
|---|---|---|
| 63-2430 | 1/1988 | Japan . |
| 4137933 | 5/1992 | Japan . |
| 8111694 | 4/1996 | Japan . |

*Primary Examiner*—Dwayne D. Bost
*Assistant Examiner*—Quochien B. Vuong
*Attorney, Agent, or Firm*—Pollock, Vande Sande & Amernick

[57] ABSTRACT

A mobile radio wave receiver including an automatic gain control amplifier, an electric field intensity detection circuit, an error correction circuit, and an error correction error detection circuit is disclosed. The automatic gain controlling is selectively effected in accordance with the detected electric field intensity and a degree of the detected error correction errors. The mobile radio wave receiver further includes a bandpass filter with a first variable bandwidth and a waveform shaping circuit with a second variable bandwidth, wherein the first and second variable bandwidths are controlled in accordance with the detected electric field intensity and the degree of the error correction errors.

4 Claims, 3 Drawing Sheets

MOBILE RADIO WAVE RECEIVER WITH ADAPTIVE AUTOMATIC GAIN CONTROL

BACKGROUND OF THE INVENTION

1. Field of the Invention

This invention relates to a mobile radio wave receiver with automatic gain control.

2. Description of the Prior Art

A mobile radio wave receiver including an automatic gain control circuit for controlling a gain of a high frequency amplifier is known.

FIG. 3 is a block diagram of such prior art a mobile radio wave receiver.

A reception signal from an antenna 1 is supplied to a high frequency amplifier 2 of which gain is controlled by an automatic gain control circuit 3. An output of the high frequency amplifier 2 is supplied to a frequency conversion circuit 4. The frequency conversion circuit 4 converts the output of the high frequency amplifier 2 into an intermediate frequency signal (IF signal) by one of mixers 42a and 42b supplied with local oscillation signals from local oscillators 41a and 41b and the converted signal is supplied to a demodulation circuit 5. The demodulation circuit 5 including a bandpass filter 6, a demodulation signal generation circuit 7, and a waveform shaping filter generates and outputs a demodulated signal, wherein bandwidths of the bandpass filter 6 and the waveform shaping filter 8 are fixed.

The automatic gain control circuit 3 decreases the gain when the electric field is relatively high to prevent interdemodulation interference.

SUMMARY OF THE INVENTION

The aim of the present invention is to provide a superior mobile radio wave receiver.

According to the present invention, a mobile radio wave receiver is provided, which comprises: an antenna for receiving a radio wave signal including a desired component which includes data and error correction code data; an automatic-gain-controlled-amplifier for amplifying the received radio wave signal with a gain controlled in accordance with a gain control signal; an intermediate frequency signal generation circuit for generating an intermediate frequency signal from an output of the automatic-gain-controlled-amplifier; a demodulation circuit for demodulating the intermediate frequency signal and detecting the data and the error correction code data to output the detected data and the detected error correction code data; an electric field intensity detection circuit responsive to the intermediate frequency signal generation circuit for detecting an electric field intensity of the received radio wave signal; a comparing portion for comparing the detected electric field intensity with a reference; and a control portion responsive to the comparing portion and the electric field intensity detection circuit for generating the gain control signal in accordance with the detected electric field intensity when the detected electric field intensity is not lower than a reference and holding the gain control signal when the detected electric field intensity is lower than the reference.

In the mobile radio wave receiver, the demodulation circuit includes a bandpass filter for bandpass-filtering the intermediate frequency signal with a first variable bandwidth to detect the desired component, a demodulation signal generation circuit for generating a demodulation signal from the detected desired component, and a waveform shaping filter with a second variable bandwidth for waveform-shaping the demodulation signal to output the detected data and the detected error correction code data, and the mobile radio wave receiver further comprises a bandwidth control circuit for making the first and second variable bandwidths in a narrow bandwidth condition when the detected electric field intensity is lower than the reference and making the first and second bandwidths in a wide bandwidth condition when the detected electric field intensity is not lower than the reference.

The mobile radio wave receiver may further comprise: an error correction circuit for detecting and correcting errors in the detected data with the detected error correction code data to output error-corrected data and generating a pulse in response to each of the errors; a counter for counting the pluses and outputting a count value; and a second comparing portion for comparing the count value with a second reference, wherein the control portion generates the gain control signal in accordance with the detected electric field intensity when the detected electric field intensity is not lower than the reference and the count value is higher than the second reference. In this case, the control portion may firstly generate the gain control signal indicative of a first gain control range when the detected electric field intensity is not lower than the reference and the count value is higher than the second reference and then, the control portion receives the comparing result from the second comparing portion and secondly generates the gain control signal indicative of a second gain control range, the first gain control range being higher than the second gain control range.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described an embodiment of this invention.

Figure 1:
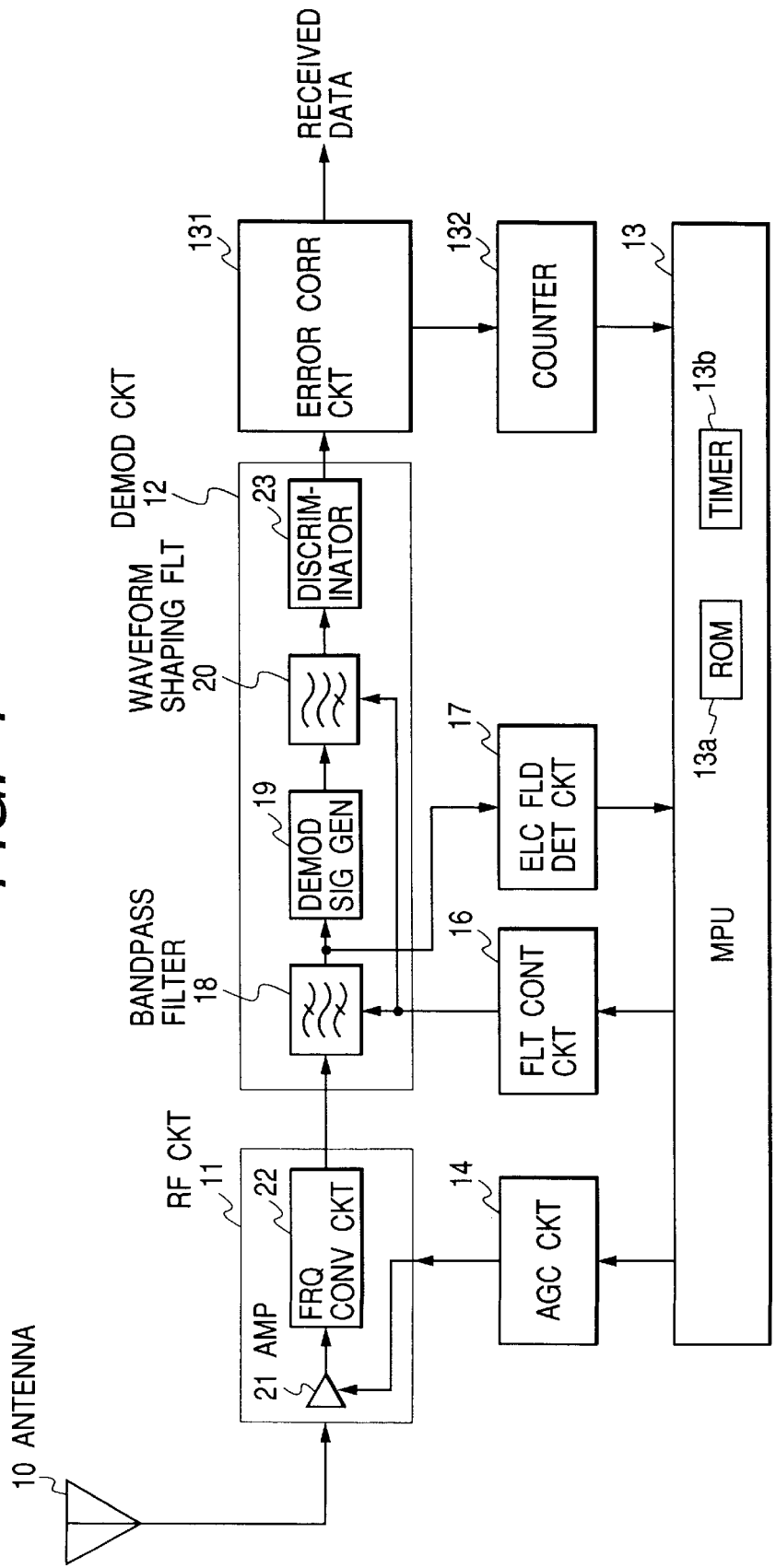
FIG. 1 is a block diagram of a mobile radio wave receiver of an embodiment of this invention.

FIG. 1 is a block diagram of a mobile radio wave receiver of an embodiment of this invention.

The mobile radio wave receiver of this embodiment comprises an antenna 10 for receiving a radio wave including a desired component including data and error correction code data, an RF circuit 11, including an high frequency amplifier 21 and frequency conversion circuit 22, for generating an intermediate frequency signal from an output of the antenna 1, a demodulation circuit 12 including a bandpass filter 18, a demodulation signal generation circuit 19, a waveform shaping filter 20, and a discriminator 23, for generating a demodulation signal from the intermediate frequency signal, an error correction circuit 131 for correcting the data in the demodulation signal and error correction errors in accordance with the error correction code data in the demodulation signal and outputting error-corrected data and an error correction error signal, an electric filed detection circuit 17 for detecting an electric field intensity of the desired component in the received radio wave signal from an output the bandpass filter 18 or the intermediate frequency signal, a counter 132 for counting the number of times of error-correction errors in the error correction circuit 131, a microprocessor 13 responsive to the electric field detection circuit 17 and the counter 132 for generating an automatic gain control data and filter control data, an automatic gain control circuit 14 for controlling the gain of the high frequency amplifier 21 in accordance with the automatic gain control data, and a filter control circuit 16 for controlling a bandwidth of the bandpass filter 18 and a bandwidth of the wave-shaping filter 20, that is, the bandwidth of the demodulation circuit 12 in accordance with the filter control data.

The antenna 10 receives the radio wave signal including the desired component. The RF circuit 11 includes the high frequency amplifier 21 for amplifying the received radio wave signal with its gain controlled by the automatic gain control circuit 14 and the frequency conversion circuit 22 for generating the intermediate frequency signal from an output of the antenna 1. The frequency conversion circuit 22 includes a quadrature mixing circuit (not shown) and at least a local oscillator (not shown) for supplying a local oscillation signal to the quadrature mixing circuit.

The bandpass filter 18 effects bandpass-filtering the intermediate frequency signal with the bandwidth controlled to output a baseband signal. The demodulation signal generation circuit 19 effecting FM demodulation to output FM-demodulated signal. The waveform shaping filter 20 effects waveform-shaping the binary signal with it bandwidth controlled. The discriminator 23 discriminates the output of the waveform shaping filter 20 to supply an NRZ signal as the demodulation signal of the demodulation circuit 12 to the error correction circuit 131.

The error correction circuit 131 corrects data in the demodulation signal in accordance with error codes included in the demodulation signal and outputs the error-corrected received data.

The electric filed detection circuit 17 detects the electric field intensity of the desired component of the received radio wave signal from an intermediate frequency signal in the demodulation circuit 12. The counter 132 counts the number of times of error-correction errors in the error correction circuit 131. That is, the error correction circuit 131 outputs a pulse when error correction is impossible and the counter 132 counts the pulses.

The microprocessor 13 generates the automatic gain control data and the filter control data in accordance with the detected electric field intensity from the electric field detection circuit 17 and the count value from the counter 132 to generate the automatic gain control data and filter control data in accordance with a program stored in a ROM 13a provided therein.

The automatic gain control circuit 14 controls the gain of the high frequency amplifier 21 in accordance with the automatic gain control data from the microprocessor 13. The filter control circuit 16 generates the filter control signal to control the pass-band characteristics of the bandpass filter 18 and the wave-shaping filter 20. Then, the bandwidth of the demodulation circuit 12 is controlled in accordance with the filter control data from the microprocessor.

Figure 2:
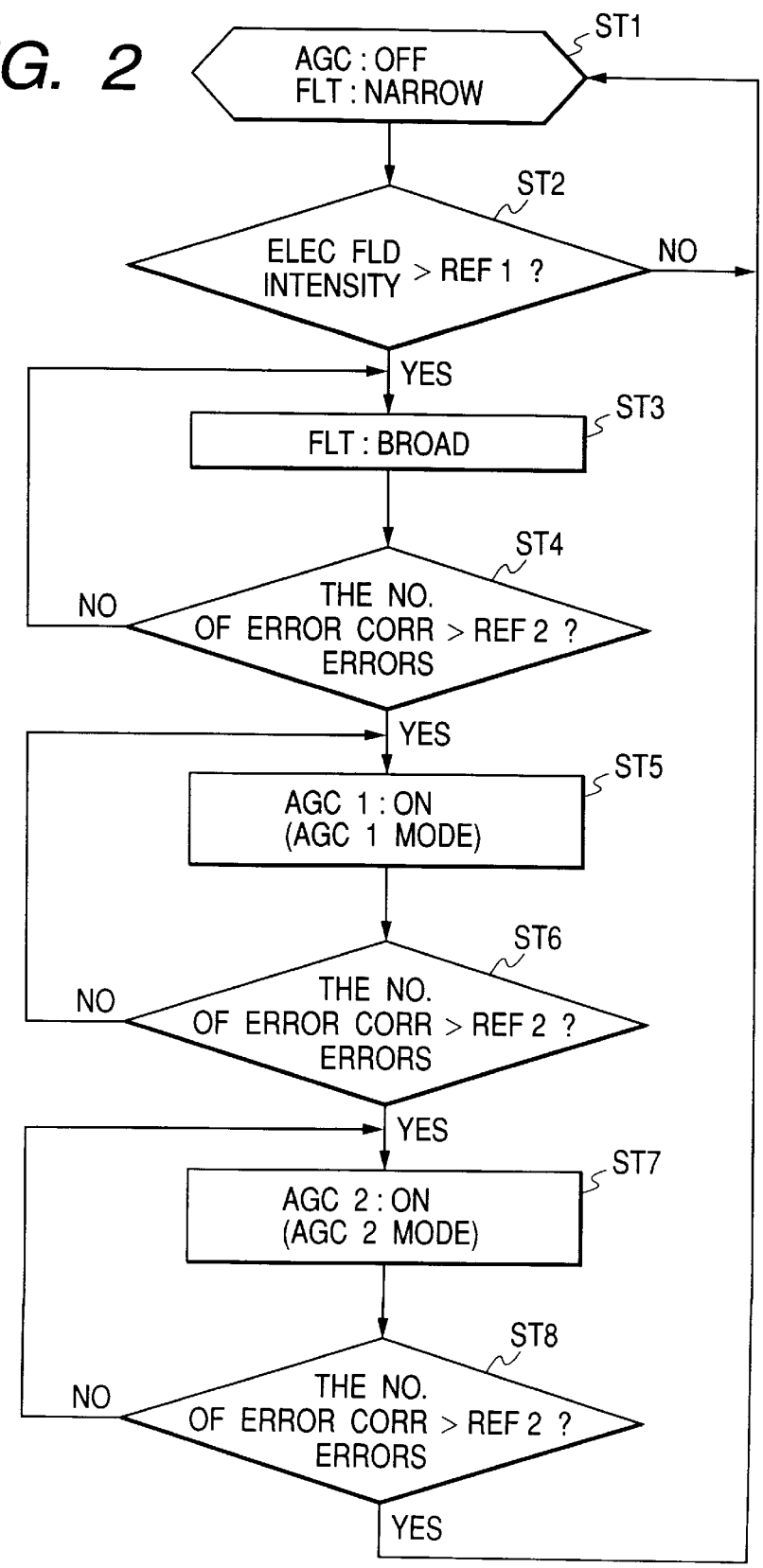
FIG. 2 shows a flow chart of the embodiment showing an operation of the microprocessor 13 shown in FIG. 1.
Figure 3:
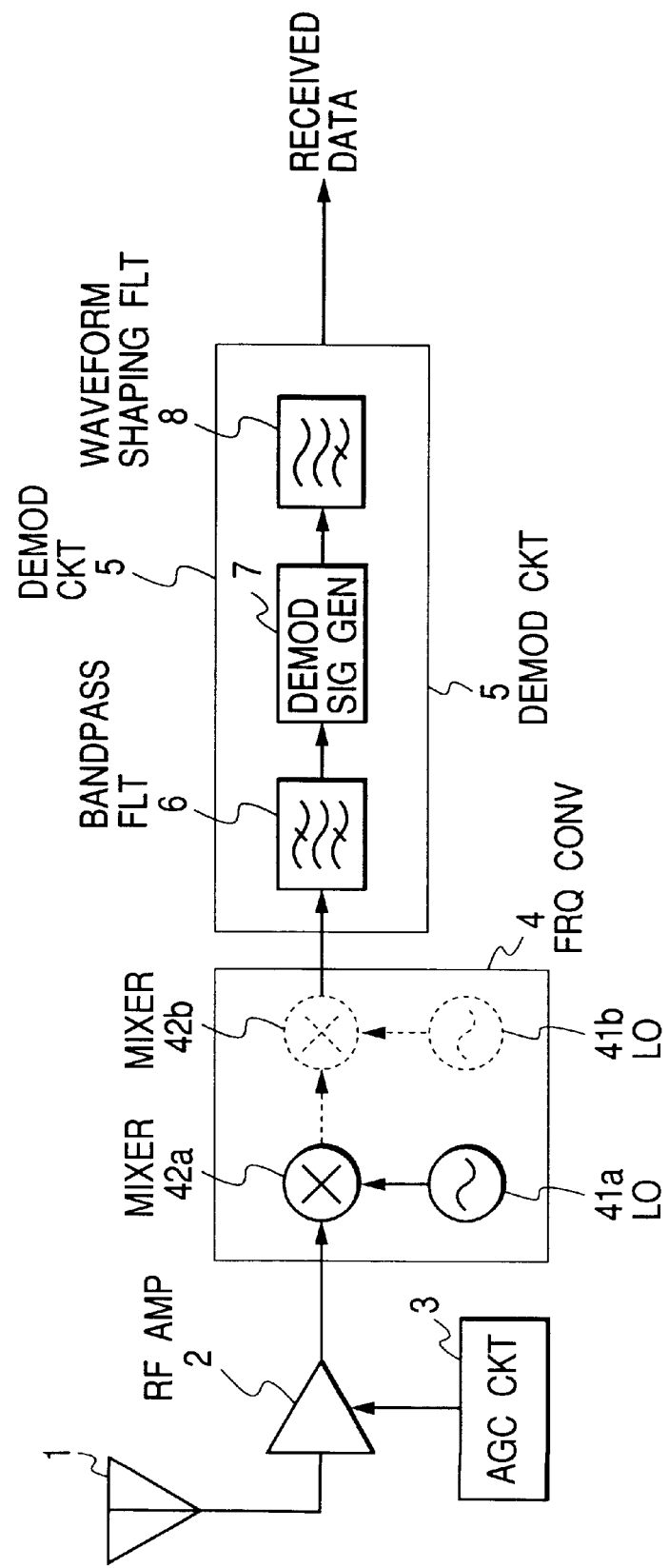
FIG. 3 is a block diagram of a prior art mobile radio wave receiver.

FIG. 2 shows a flow chart of this embodiment showing the operation of the microprocessor 13 shown in FIG. 1.

At first, it is assumed that the electric field intensity is weak. Then, the microprocessor 13 effects an initial setting, that is, the automatic gain control is not effected, i.e., the gain of the high frequency amplifier is set to a predetermined value and the bandwidth of the demodulation circuit 12 (bandwidths of the bandpass filter 18 and the waveform shaping filter) is set to the narrow bandwidth in step st1. In the following step st2, the microprocessor 13 receives the detected electric field intensity data from the electric field detection circuit 17 and compares the detected electric field intensity data with a first reference REF1. If the detected electric field intensity data is not higher than the first reference REF1, that is, the electric field is weak, processing returns to step st1 to hold the initial setting in step st1.

If the detected electric field intensity data is higher than the first reference REF1 in step st2, that is, the detected electric field intensity is strong, the microprocessor 13 generates the filter control data indicating a broad bandwidth to set the bandwidth of the demodulation circuit 12 to the broad band (broad bandwidth condition) in step st3.

In the following step st4, the microprocessor 13 receives the count data from the counter 132, that is, the number of times of error correction errors for a predetermined interval using a timer 13b provided therein and compares the number of times of error correction errors with a second reference REF2. If the number of times of error correction errors is not higher than the second reference REF2, that is, the error correction errors are relatively few, processing returns to step st3 to hold the broad bandwidth condition of the demodulation circuit 12.

If the number of times of error correction errors is higher than the second reference REF2 in step st4, that is, the error correction errors are relatively frequent, the microprocessor 13 generates, in step st5, the automatic gain control data in an AGC1 mode, that is, the automatic gain control is effected within a first range which is higher than that of an AGC2 mentioned later.

In the following step st6, the microprocessor 13 receives the count data in the AGC1 mode from the counter 132 again, that is, the number of times of error correction errors for the predetermined interval while the automatic gain control is effected within the first range and compares the number of times of error correction errors with the second reference REF2. If the number of times of error correction errors is not higher than the second reference REF2, that is, the error correction errors are relatively few, processing returns to step st5 to hold the broad bandwidth condition of the demodulation circuit 12 and the automatic gain control in the AGC1 mode.

If the number of times of error correction errors is higher than the second reference REF2 in step st6, that is, the error correction errors are relatively frequent in the AGC1 mode, which is considered to be too higher electric field intensity, the microprocessor 13 generates, in step st7, the automatic gain control data in the AGC2 mode, that is, the automatic gain control is effected within a second range which is not higher than that of the AGC1 mentioned above.

In the following step st8, the microprocessor 13 receives the count data in the AGC2 mode from the counter 132 again, that is, the number of times of error correction errors for the predetermined interval in the AGC2 mode and compares the number of times of error correction errors with the second reference REF2. If the number of times of error correction errors is not higher than the second reference REF2, that is, the error correction errors are relatively few, processing returns to step st7 to hold the broad bandwidth condition of the demodulation circuit 12 and the automatic gain control in the AGC2 mode.

If the number of times of error correction errors is higher than the second reference REF2 in step st8, that is, the error correction errors are relatively frequent, processing returns to step st1 because the condition may vary.

As mentioned above, according to this invention, the automatic gain controlling and the bandwidth controlling are effected in consideration of the electric field intensity and a degree of the error correction errors, so that even in a condition of a weak electric field intensity, in a condition of a strong electric field intensity, or in a variable electric field intensity, the receiving operation can be provided suitably.

What is claimed is:

1. A mobile radio wave receiver comprising:
    an antenna for receiving a radio wave signal including a desired component which includes data and error correction code data;
    automatic-gain-controlled-amplifying means for amplifying the received radio wave signal with a gain controlled in accordance with a gain control signal;
    intermediate frequency signal generation means generating an intermediate frequency signal from an output of said automatic-gain-controlled-amplifying means;
    demodulation means for demodulating said intermediate frequency signal and detecting said data and said error correction code data to output the detected data and the detected error correction code data including:
        bandpass filter means for bandpass-filtering said intermediate frequency signal with a first variable bandwidth to detect said desired component;
        demodulation signal generation means for generating a demodulation signal from the detected desired component; and
        waveform shaping filter means with a second variable bandwidth for waveform-shaping said demodulation signal to output the detected data and the detected error correction code data;
    electric field intensity detection means responsive to said intermediate frequency signal generation means detecting an electric field intensity of said radio wave signal;
    comparing means for comparing said detected electric field intensity with a reference;
    control means responsive to said comparing means and said electric field Intensity detection means for generating said gain control signal in accordance with said detected electric field intensity when the detected electric field intensity is not lower than a reference and holding said gain control signal when the detected electric field intensity is lower than said reference and
    bandwidth control means for making said first and second variable bandwidths in a narrow bandwidth condition when the detected electric field intensity is lower than said reference and making said first and second bandwidths in a wide bandwidth condition when the detected electric field intensity is not lower than said reference.

2. The mobile radio wave receiver as claimed in claim 1, wherein said electric field intensity detection means detects said electric field intensity from the detected desired component.

3. The mobile radio wave receiver comprising:
    an antenna for receiving a radio wave signal including a desired component which includes data and error correction code data;
    automatic-gain-controlled-amplifying means for amplifying the received radio wave signal with a gain controlled in accordance with a gain control signal;
    intermediate frequency signal generation means generating an intermediate frequency signal from an output of said automatic-gain-controlled-amplifying means;
    demodulation means for demodulating said intermediate frequency signal and detecting said data and said error correction code data to output the detected data and the detected error correction code data;
    electric field intensity detection means responsive to said intermediate frequency signal generation means detecting an electric field intensity of said radio wave signal;
    comparing means for comparing said detected electric field intensity with a reference; and
    control means responsive to said comparing means and said electric field Intensity detection means for generating said gain control signal in accordance with said detected electric field intensity when the detected electric field intensity is not lower than a reference and holding said gain control signal when the detected electric field intensity is lower than said reference;
        error correction means for detecting and correcting errors in the detected data with the detected error correction code data to output error-corrected data and generating a pulse in response to each of said errors;
        counting means for counting said pluses and outputting a count value; and
        second comparing means for comparing said count value with a second reference, wherein said control means generates said gain control signal in accordance with said detected electric field intensity when the detected electric field intensity is not lower than said reference and said count value is higher than said second reference.

4. The mobile radio wave receiver as claimed in claim 3, wherein said control means firstly generates said gain control signal indicative of a first gain control range when the detected electric field intensity is not lower than said reference and said count value is higher than said second reference and then, said control means receives the comparing result from said second comparing means and secondly generates said gain control signal indicative of a second gain control range, said first gain control range being higher than said second gain control range.

* * * * *